(12) United States Patent
Lim et al.

(10) Patent No.: US 11,632,228 B2
(45) Date of Patent: *Apr. 18, 2023

(54) CLOCK AND DATA RECOVERY CIRCUIT AND A DISPLAY APPARATUS HAVING THE SAME

(71) Applicant: SAMSUNG ELECTRONICS CO., LTD., Suwon-si (KR)

(72) Inventors: Jungpil Lim, Hwaseong-si (KR); Kyungho Ryu, Hwaseong-si (KR); Kilhoon Lee, Seoul (KR); Hyunwook Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/476,782

(22) Filed: Sep. 16, 2021

(65) Prior Publication Data

US 2022/0006604 A1    Jan. 6, 2022

Related U.S. Application Data

(63) Continuation of application No. 16/878,728, filed on May 20, 2020, now Pat. No. 11,133,920.

(30) Foreign Application Priority Data

Sep. 3, 2019  (KR) .......... 10-2019-0108758
Mar. 18, 2020 (KR) .......... 10-2020-0033117

(51) Int. Cl.
*H04L 7/00*       (2006.01)
*H03L 7/10*       (2006.01)
*H03L 7/099*      (2006.01)
*H03L 7/089*      (2006.01)
*H03L 7/113*      (2006.01)

(52) U.S. Cl.
CPC .......... *H04L 7/0033* (2013.01); *H03L 7/0891* (2013.01); *H03L 7/099* (2013.01);
(Continued)

(58) Field of Classification Search
CPC . H03L 7/10; H03L 7/101; H03L 7/102; H03L 7/104; H03L 7/112; H03L 7/099;
(Continued)

(56) References Cited

U.S. PATENT DOCUMENTS 6,037,814 A    3/2000  Hirakawa
6,326,826 B1  12/2001  Lee et al.
(Continued)

*Primary Examiner* — Betsy Deppe
(74) *Attorney, Agent, or Firm* — F. Chau & Associates, LLC

(57) ABSTRACT

A display device including: a timing controller outputting a reference clock signal and a data packet, wherein the data packet includes a clock signal embedded in a data signal; a clock and data recovery (CDR) circuit receiving the reference clock signal and the data packet; and a display panel displaying an image based on the data packet, wherein, when the CDR circuit receives the reference clock signal, a frequency band of the reference clock signal is detected using a first internal clock signal, a parameter associated with jitter characteristics of the clock and data recovery circuit is adjusted according to the detected frequency band, and a second internal clock signal is output by adjusting a frequency of the first internal clock signal, and when the CDR circuit receives the data packet, the data signal and a clock signal synchronized with the data signal are recovered from the data packet.

20 Claims, 13 Drawing Sheets

(52) U.S. Cl.
CPC .............. *H03L 7/102* (2013.01); *H03L 7/113* (2013.01); *H04L 7/0087* (2013.01)

(58) Field of Classification Search
CPC ....... H03L 7/0995; H03L 7/085; H03L 7/087; H03L 7/089; H03L 7/0891; H03L 7/08; H03L 7/0807; H03L 7/113; H04L 7/0004; H04L 7/0016; H04L 7/0033; H04L 7/0079; H04L 7/0087
See application file for complete search history.

(56) References Cited

U.S. PATENT DOCUMENTS

| | | | |
|---|---|---|---|
| 6,563,387 B2 * | 5/2003 | Hirano | H03L 7/1075 |
| | | | 331/25 |
| 7,352,249 B2 | 4/2008 | Balboni et al. | |
| 7,746,972 B1 | 6/2010 | Melanson et al. | |
| 8,750,448 B2 | 6/2014 | Mazkou et al. | |
| 8,804,892 B2 | 8/2014 | Kyles | |
| 8,829,958 B2 | 9/2014 | Asaduzzaman et al. | |
| 9,608,800 B2 | 3/2017 | Shi et al. | |
| 10,003,345 B2 * | 6/2018 | Lee | H03L 7/113 |
| 10,193,561 B2 * | 1/2019 | Lesso | H03L 7/181 |
| 11,133,920 B2 * | 9/2021 | Lim | H04L 7/0004 |
| 2005/0180536 A1 | 8/2005 | Payne et al. | |
| 2009/0122939 A1 | 5/2009 | Hoang et al. | |
| 2011/0037758 A1 | 2/2011 | Lim et al. | |
| 2011/0156780 A1 | 6/2011 | Kang et al. | |
| 2011/0188621 A1 | 8/2011 | Asaduzzaman et al. | |
| 2015/0349945 A1 | 12/2015 | Green et al. | |
| 2016/0036485 A1 * | 2/2016 | Nagaso | H04B 1/403 |
| | | | 455/76 |
| 2020/0373928 A1 | 11/2020 | Chen et al. | |
| 2021/0067310 A1 | 3/2021 | Lim et al. | |

\* cited by examiner

CLOCK AND DATA RECOVERY CIRCUIT AND A DISPLAY APPARATUS HAVING THE SAME

CROSS-REFERENCE TO RELATED APPLICATION(S)

This application is a continuation of U.S. patent application Ser. No. 16/878,728 filed on May 20, 2020, which claims priority under 35 U.S.C. § 119 to Korean Patent Application No. 10-2019-0108758 filed on Sep. 3, 2019, and Korean Patent Application No. 10-2020-0033117 filed on Mar. 18, 2020 in the Korean Intellectual Property Office, the disclosures of which are incorporated by reference herein in their entireties.

1. TECHNICAL FIELD

The present inventive concept relates to a clock and data recovery circuit and a display device including the same.

2. DESCRIPTION OF RELATED ART

A display device is an output device for presentation of information in visual form, for example. The display device may include a display driving circuit (for example, a display driving integrated circuit (DDI)) for receiving a data packet from a timing controller, and generating various signals related to image representation using the data packet. The display device may implement an image on a display panel using the signals generated by the DDI.

High resolution display devices require an interface capable of efficiently and stably providing a data packet between the timing controller and the DDI.

In such a high resolution display device, there is provided a clock and data recovery circuit for recovering a clock signal and a data signal.

SUMMARY

According to an exemplary embodiment of the present inventive concept, a display device includes a timing controller for outputting a reference clock signal and a data packet, wherein the data packet includes a clock signal embedded in a data signal; a clock and data recovery circuit for receiving the reference clock signal and the data packet; and a display panel for displaying an image based on the data packet, wherein, when the clock and data recovery circuit receives the reference clock signal from the timing controller, a frequency band of the reference clock signal is detected using a first internal clock signal, a parameter associated with jitter characteristics of the clock and data recovery circuit is adjusted according to the detected frequency band, and a second internal clock signal is output by adjusting a frequency of the first internal clock signal, and when the clock and data recovery circuit receives the data packet from the timing controller, the data signal and a clock signal synchronized with the data signal are recovered from the data packet.

According to an exemplary embodiment of the present inventive concept, a clock and data recovery circuit includes an automatic frequency controller for receiving a reference clock signal and a first feedback clock signal, counting the number of rising edges of the first feedback clock signal while a period of the reference clock signal is repeated N times, detecting a frequency band of the first feedback clock signal based on the number of rising edges counted, receiving a second feedback clock signal generated by adjusting a frequency of the first feedback clock signal according to the frequency band, and outputting a control code corresponding to a difference between a frequency of the reference clock signal and a frequency of the second feedback clock signal; and a voltage-controlled oscillator for receiving the control code and the frequency band from the automatic frequency controller, outputting the second feedback clock signal by performing coarse tuning using the frequency band, and outputting a third feedback clock signal by performing fine tuning using the control code and a control voltage.

According to an exemplary embodiment of the present inventive concept, a clock and data recovery circuit includes an automatic frequency controller for detecting a frequency band of a reference clock signal using a first internal clock signal, when the clock and data recovery circuit receives the reference clock signal; a voltage-controlled oscillator for outputting a second internal clock signal according to the frequency band, and outputting a third internal clock signal based on a control voltage; a charge pump for determining a current to be output in response to a phase control signal corresponding to a phase difference between the reference clock signal and the second internal clock signal; and a loop filter for outputting the control voltage to the voltage-controlled oscillator based on the current output by the charge pump, wherein a parameter for determining jitter characteristics of the clock and data recovery circuit is adjusted according to the detected frequency band.

According to an exemplary embodiment of the present inventive concept, a clock and data recovery circuit includes: a frequency detector configured to detect a frequency band of a reference clock signal received from a timing controller by using a first internal clock signal; and a charge pump, a loop filter and a voltage controlled oscillator, wherein the clock and data recovery circuit is configured to adjust a parameter of each of the charge pump, the loop filter and the voltage controlled oscillator according to the detected frequency band, and wherein the voltage controlled oscillator is configured to generate a second internal clock signal according to the detected frequency band.

BRIEF DESCRIPTION OF THE DRAWINGS

The above and other features of the present inventive concept will be more clearly understood by describing in detail exemplary embodiments thereof in conjunction with the accompanying drawings, in which.

DETAILED DESCRIPTION OF THE EMBODIMENTS

Hereinafter, exemplary embodiments of the present inventive concept will be described in detail with reference to the attached drawings.

Figure 1:
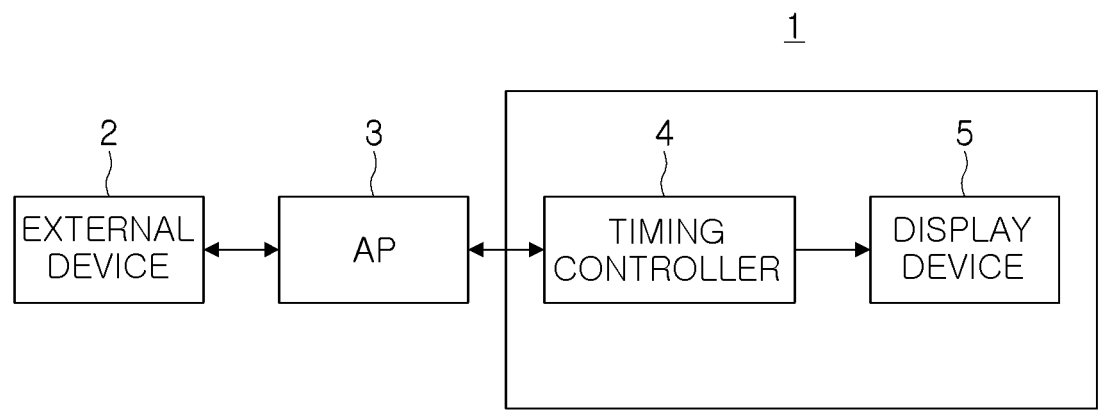
FIG. 1 is a block diagram illustrating a display system according to an exemplary embodiment of the present inventive concept.

FIG. 1 is a block diagram illustrating a display system according to an exemplary embodiment of the present inventive concept.

Referring to FIG. 1, a display system 1 may be implemented as a television (TV), a tablet personal computer (PC), a smartphone, or the like. The display system 1 may include an external device 2, an application processor (AP) 3, a timing controller 4, and a display device 5.

The external device 2 may include a set-top box, a computer (e.g., a PC), a laptop, or the like. The external device 2 is connected to the AP 3, and may receive information such as a video signal from a central server and transmit the information to the AP 3.

The timing controller 4 may receive a video signal and a control signal from the AP 3. The timing controller 4 may generate a data packet using the video signal and the control signal. In the data packet, a clock signal may be embedded in a data signal. The timing controller 4 may provide the data packet to the display device 5.

The display device 5 may be an organic light emitting diode display (OLED) or a liquid crystal display (LCD), but is not limited thereto.

The display device 5 may receive a data packet from the timing controller 4. The display device 5 may generate various signals related to image representation using the data packet. The display device 5 may implement an image on a display panel.

In FIG. 1, the timing controller 4 and the display device 5 are separately illustrated, but the timing controller 4 may be included in the display device 5.

According to an exemplary embodiment of the present inventive concept, the data packet, output by the timing controller 4, may have a wide range of frequencies. The display device 5 may include a clock and data recovery circuit for receiving the data packet. The clock and data recovery circuit may recover a data signal and a clock signal from the data packet. When the data packet has a wide range of frequencies, jitter characteristics of a clock signal recovered by the clock and data recovery circuit may not be maintained. In an exemplary embodiment of the present inventive concept, a frequency detector for detecting a frequency band of input data may be added to a clock and data recovery circuit. Thus, in a clock and data recovery circuit according to an exemplary embodiment of the present inventive concept, jitter characteristics may be uniformly maintained in a wide input frequency band without having to use an external signal.

Figure 2:
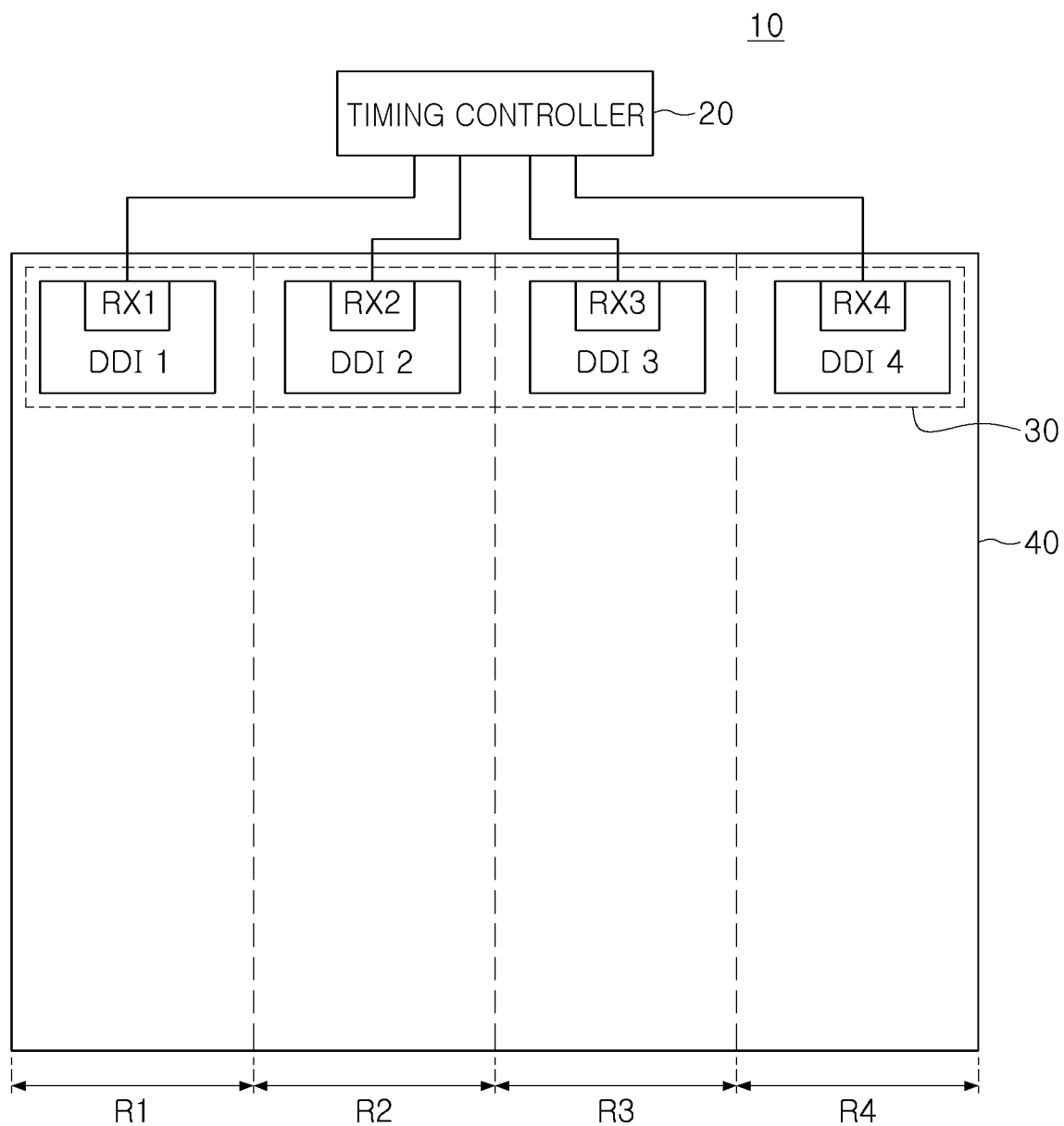
FIG. 2 is a block diagram illustrating a display device according to an exemplary embodiment of the present inventive concept.

FIG. 2 is a block diagram illustrating a display device according to an exemplary embodiment of the present inventive concept.

Referring to FIG. 2, a display device 10 may include a timing controller 20, a data driver 30, and a display panel 40. The data driver 30 may include a plurality of display driving integrated circuits (DDIs) DDI 1, DDI 2, DDI 3 and DDI 4. The data driver 30 may be directly attached to a glass substrate used in the display panel 40, or may be attached by adding a flexible film to the display panel 40.

In exemplary embodiments of the present inventive concept, the timing controller 20 may be included in each of the plurality of DDIs DDI 1 to DDI 4.

The timing controller 20 may provide a reference clock signal to the data driver 30 in an initial training mode. The data driver 30 may lock a phase locked loop (PLL) circuit, when phases of an internal clock signal and the reference clock signal are synchronized.

When the timing controller 20 receives a signal indicating that the PLL circuit is locked from the data driver 30, the timing controller 20 may provide a data packet to the data driver 30. In the data packet, a clock signal may be embedded in a data signal.

The display panel 40 may be divided into a plurality of regions R1, R2, R3 and R4. For convenience of description, the display panel 40 is illustrated as being divided into four regions R1 to R4, but the present inventive concept is not limited thereto. For example, the display panel 40 may be divided into less than four regions or more than four regions. Each of the plurality of DDIs DDI 1 to DDI 4 may control a corresponding region among four regions R1 to R4 of the display panel 40. Each of the plurality of DDIs DDI 1 to DDI 4 may display an image on a corresponding region of regions R1 to R4 of the display panel 40 based on the data packet.

The plurality of DDIs DDI 1 to DDI 4 may include receiving circuits RX1, RX2, RX3 and RX4, respectively. Each of the receiving circuits RX1 to RX4 may include a clock and data recovery (CDR) circuit. When receiving a reference clock signal from the timing controller 20, the CDR circuit may synchronize phases of an internal clock signal and the reference clock signal, and may lock a PLL circuit.

When the timing controller 20 receives a signal indicating that the PLL circuit is locked from the CDR circuit, the timing controller 20 may provide a data packet to the CDR circuit. When receiving the data packet from the timing controller 20, the CDR circuit may recover a data signal and a clock signal synchronized with the data signal from the received data packet. The CDR circuit may transmit the recovered data signal and the recovered clock signal to a logic circuit included in its DDI.

In a general display device, a CDR circuit may be optimized for a high speed operation region. An amount of data transmitted by a timing controller to the CDR circuit may vary depending on the display resolution and frame rate of the display device. For example, as the resolution increases, an amount of data increases. Thus, the CDR circuit may be used in the high speed operation region. The CDR circuit, which is optimized for the high speed operation region, may cause significant jitter in a low speed operation region. Thus, the CDR circuit may generate an error when data is recovered.

The CDR circuit according to an exemplary embodiment of the present inventive concept may detect a frequency band of the data from the input data, and may change a parameter of the CDR circuit using the detected frequency band in accordance with the frequency band. Since the parameter of the CDR circuit is adjusted according to the input frequency band in the CDR circuit, the CDR circuit may significantly reduce jitter of a clock signal to be recovered even when received data has a wide frequency band. Thus, the CDR circuit may have a wide operating frequency band.

Figure 3:
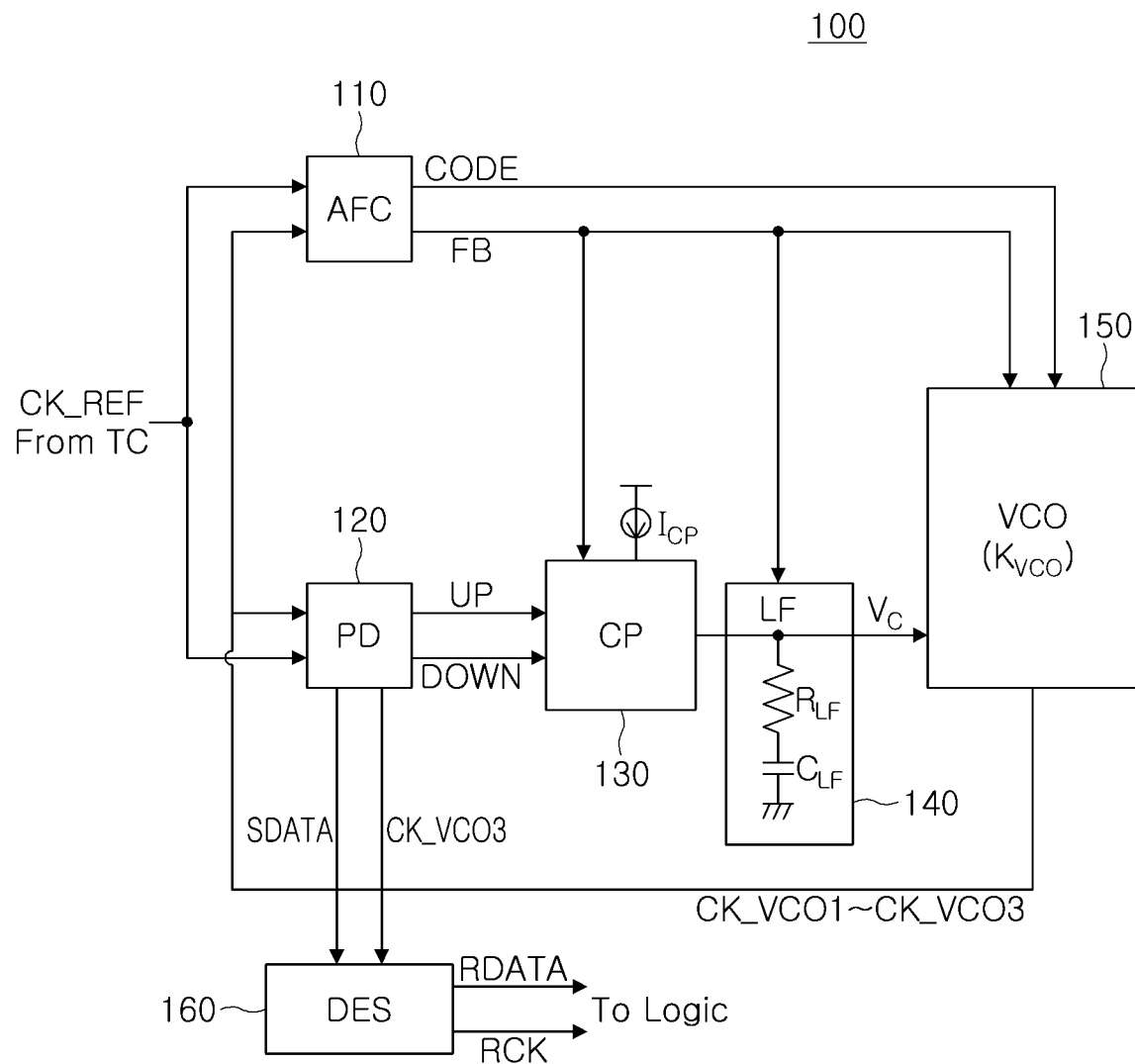
FIG. 3 is a block diagram illustrating a clock and data recovery (CDR) circuit according to an exemplary embodiment of the present inventive concept.
Figure 4A:
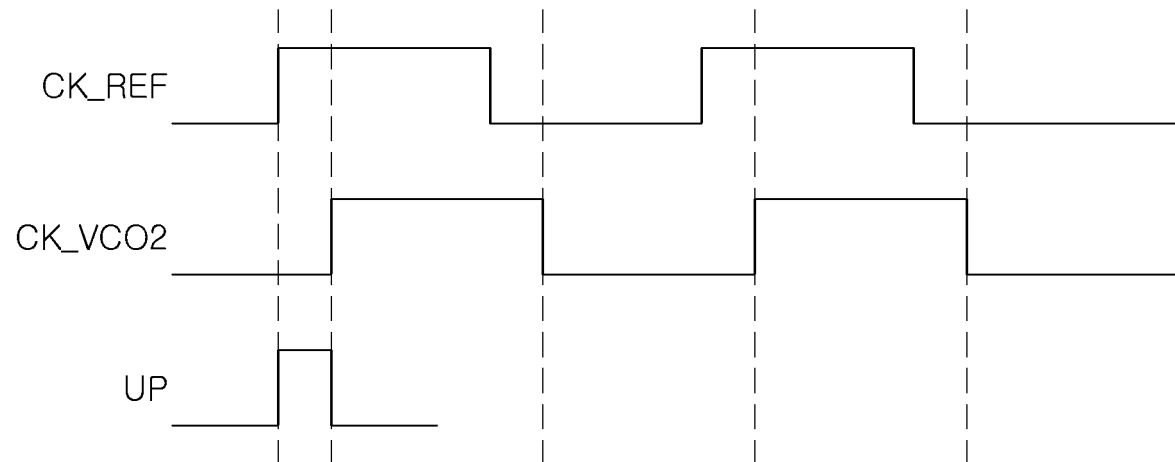
FIGS. 4A and 4B are timing diagrams illustrating an operation of a phase detector according to an exemplary embodiment of the present inventive concept.
Figure 4B:
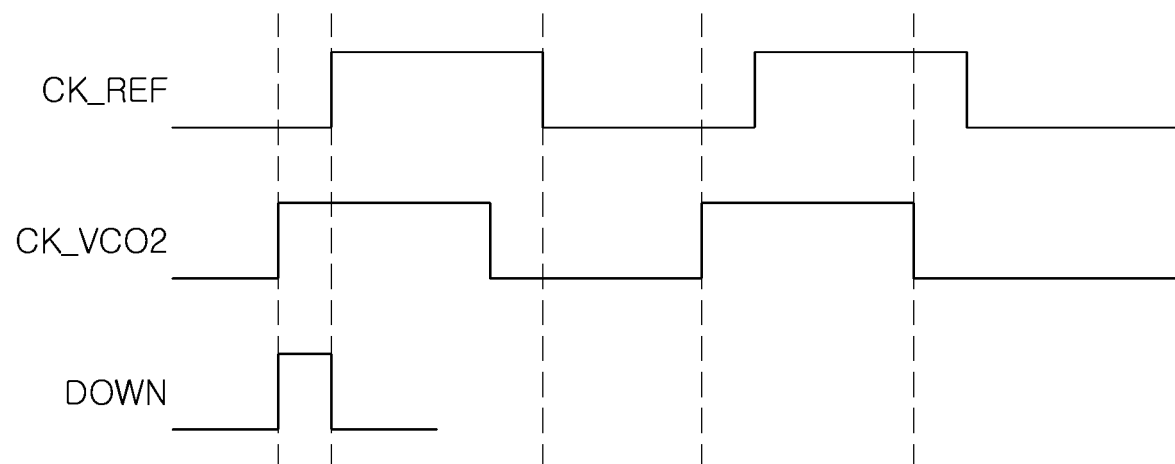
Figure 5:
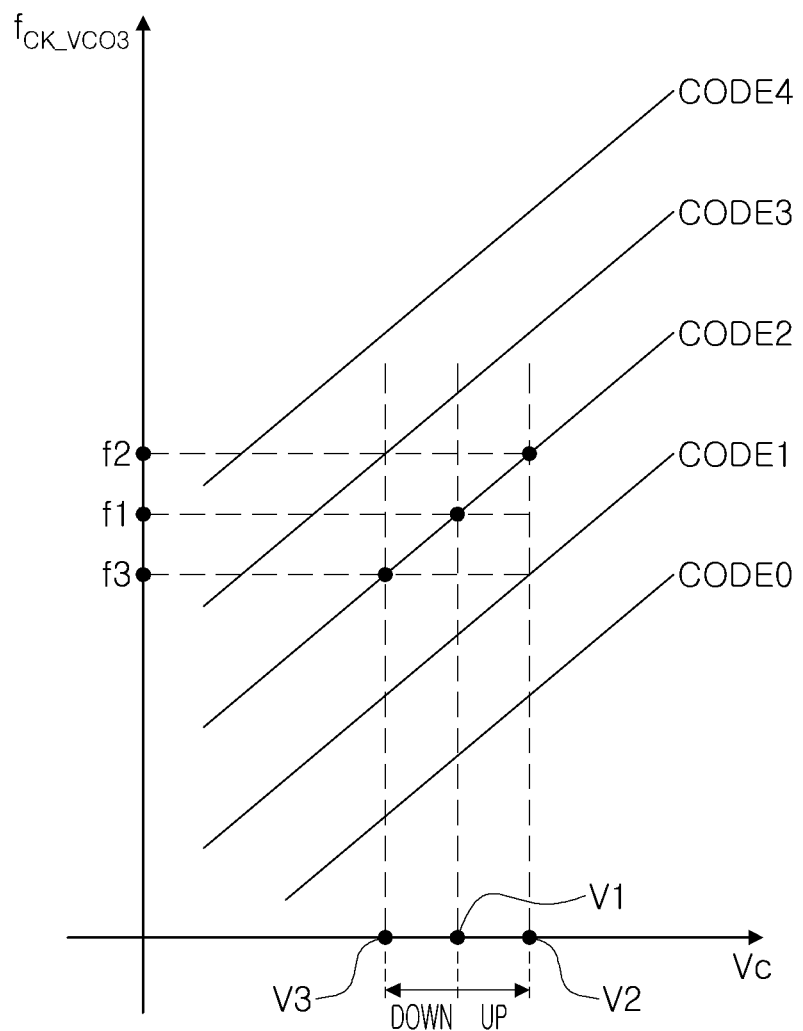
FIG. 5 is a view illustrating a method of tuning frequency in a voltage-controlled oscillator according to an exemplary embodiment of the present inventive concept.
Figure 6:
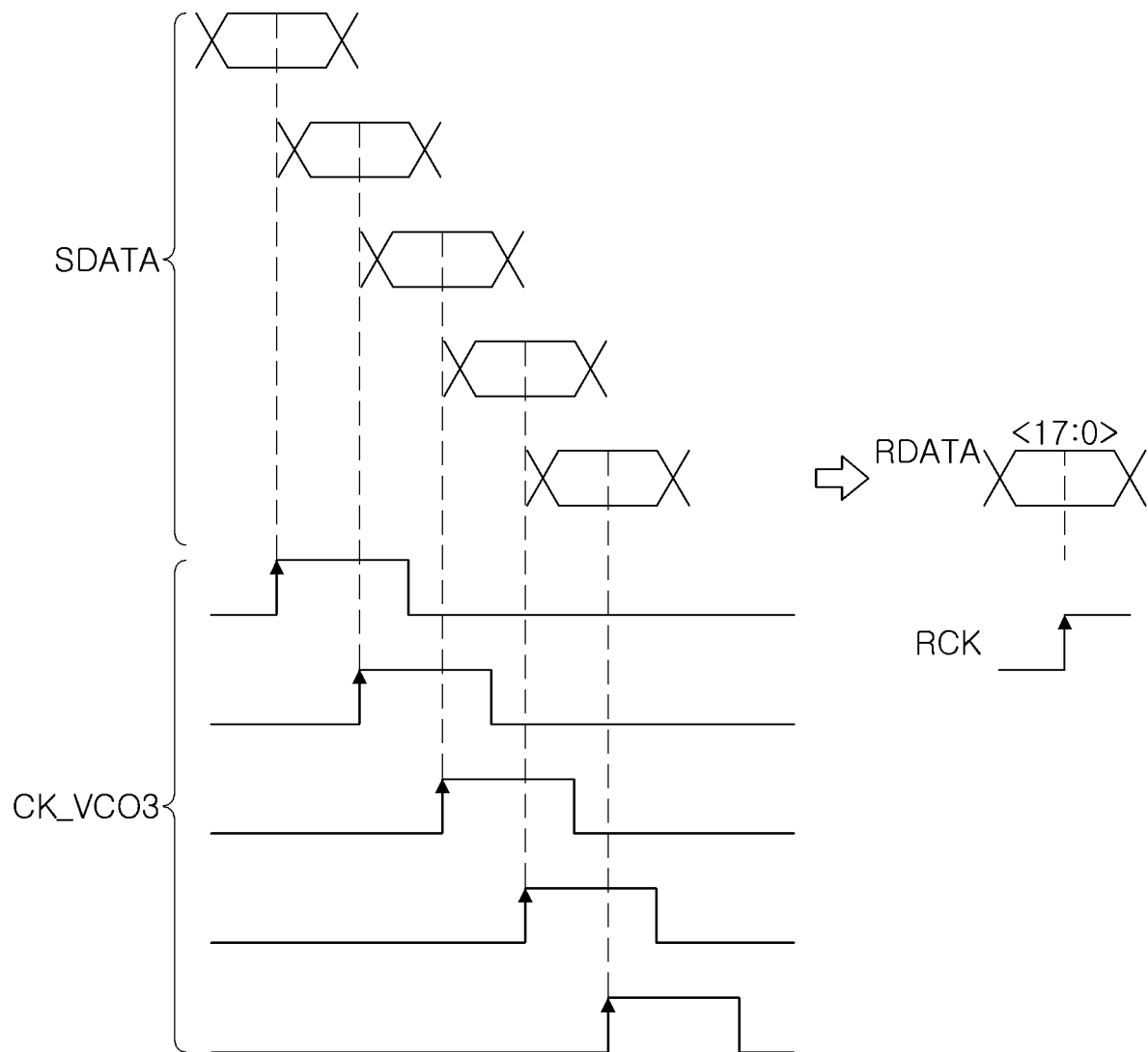
FIG. 6 is a view illustrating an operation of a phase detector and a deserializer according to an exemplary embodiment of the present inventive concept.

FIG. 3 is a block diagram illustrating a CDR circuit according to an exemplary embodiment of the present inventive concept, FIGS. 4A and 4B are timing diagrams illustrating an operation of a phase detector according to an exemplary embodiment of the present inventive concept, FIG. 5 is a view illustrating a method of tuning a frequency in a voltage-controlled oscillator according to an exemplary embodiment of the present inventive concept, and FIG. 6 is a view illustrating an operation of a phase detector and a deserializer according to an exemplary embodiment of the present inventive concept.

Referring to FIG. 3, a CDR circuit 100 may include an automatic frequency controller (AFC) 110, a phase detector (PD) 120, a charge pump (CP) 130, a loop filter (LF) 140, a voltage-controlled oscillator (VCO) 150, and a deserializer (DES) 160. The PLL circuit may include the PD 120, the CP 130, the LF 140, and the VCO 150. In other words, the CDR circuit 100 may include the PLL circuit.

The CDR circuit 100 may receive a reference clock signal CK_REF from the timing controller TC, in an initial training mode. The CDR circuit 100 may synchronize phases of the reference clock signal CK_REF and internal clock signals CK_VCO1, CK_VCO2 and CK_VCO3. When the phases of the clock signal CK_REF and the internal clock signals CK_VCO1 to CK_VCO3 are synchronized, the PLL circuit may be locked.

When the PLL circuit is locked, the CDR circuit 100 may receive a data packet from the timing controller TC. In the data packet, a clock signal may be embedded in a data signal. The CDR circuit 100 may recover a data signal and a clock signal synchronized with the data signal from the data packet in a normal operation mode.

Herein, it will be mainly described that, when receiving the reference clock signal CK_REF from the timing controller TC in the initial training mode, the CDR circuit 100 detects a frequency band of the reference clock signal CK_REF, and changes a parameter of the CDR circuit 100 in accordance with the detected frequency band. In other words, a parameter of the CDR circuit 100 may change when the frequency band of the reference clock signal CK_REF changes. The CDR circuit 100 may generate an internal clock signal following the reference clock signal CK_REF based on the changed parameter.

The AFC 110 may receive a reference clock signal CK_REF, output by the timing controller TC, and a first internal clock signal CK_VCO1, output by the VCO 150. The AFC 110 may determine a frequency band FB of the reference clock signal CK_REF using the first internal clock signal CK_VCO1. The AFC 110 may output the frequency band FB of the reference clock signal CK_REF to the CP 130, the LF 140, and the VCO 150.

Thus, the CDR circuit 100 may control a parameter of each of the CP 130, the LF 140, and the VCO 150 using the frequency band FB of the reference clock signal CK_REF. For example, the parameter may include an amount $I_{CP}$ of a current output by the CP 130, resistance of a resistor $R_{LF}$ of the LF 140, capacitance of a capacitor $C_{LF}$ of the LF 140, and a gain $K_{VCO}$ of the VCO 150. In other words, the CDR circuit 100 may perform coarse tuning using the frequency band FB of the reference clock signal CK_REF. The VCO 150 may output a second internal clock signal CK_VCO2 in response to a frequency band FB of the reference clock signal CK_REF. A method of determining a second internal clock signal CK_VCO2 in response to a frequency band FB by the VCO 150 will be described with reference to FIG. 9 in detail.

The PD 120 may receive the reference clock signal CK_REF output by the timing controller TC and the second internal clock signal CK_VCO2 output by the VCO 150. The PD 120 may output phase control signals UP and DOWN corresponding to a phase difference between the reference clock signal CK_REF and the second internal clock signal CK_VCO2.

As illustrated in FIG. 4A, when a phase of the second internal clock signal CK_VCO2 is slower than a phase of the reference clock signal CK_REF, the PD 120 may generate a pulse signal UP to advance a phase of the reference clock signal CK_REF. The pulse signal UP may be disposed between rising edges of the reference clock signal CK_REF and the second internal clock signal CK_VCO2.

As illustrated in FIG. 4B, when a phase of the second internal clock signal CK_VCO2 is faster than a phase of the reference clock signal CK_REF, the PD 120 may generate a pulse signal DOWN to delay a phase of the reference clock signal CK_REF. The pulse signal DOWN may be disposed between rising edges of the second internal clock signal CK_VCO2 and the reference clock signal CK_REF.

Referring back to FIG. 3, the CP 130 may charge a predetermined current (or a charge) to the capacitor $C_{LF}$ of the LF 140 in response to a first phase control signal UP. The CP 130 may discharge a current (or a charge) stored in the capacitor $C_{LF}$ of the LF 140 in response to a second phase control signal DOWN. The LF 140 may vary a control voltage $V_C$ output to the VCO 150 according to an amount of a current output by the CP 130.

The AFC 110 may receive a reference clock signal CK_REF, output by the timing controller TC, and a second internal clock signal CK_VCO2, output by the VCO 150. The AFC 110 may output a control code CODE corresponding to a difference between a frequency of the reference clock signal CK_REF and a frequency of the second internal clock signal CK_VCO2. The control code CODE may consist of n bits.

The VCO 150 may receive the control code CODE from the AFC 110, and may receive the control voltage $V_C$ from the LF 140. The VCO 150 may output a third internal clock signal CK_VCO3 following the reference clock signal CK_REF in response to the control code CODE and the control voltage $V_C$. In other words, the VCO 150 may output the third internal clock signal CK_VCO3 by performing fine tuning using the control code CODE and the control voltage $V_C$.

Referring to FIGS. 3 and 5, the VCO 150 may receive the control code CODE from the AFC 110, and may receive the control voltage $V_C$ from the LF 140. For example, the control code CODE may be a second control code CODE2, and the control voltage $V_C$ may be a first control voltage V1. The VCO 150 may output a third internal clock signal CK_VCO3 having first frequency f1 in response to the second control code CODE2 and the first control voltage V1.

According to an exemplary embodiment of the present inventive concept, the control voltage $V_C$ may be changed according to phase control signals UP and DOWN of the PD 120. For example, when a phase of the second internal clock signal CK_VCO2 is slower than a phase of the reference clock signal CK_REF, the PD 120 outputs the first phase control signal UP, and thus, the control voltage $V_C$ may be changed to the second control voltage V2. The VCO 150 may output a third internal clock signal CK_VCO3 having second frequency f2 in response to the second control code CODE2 and the second control voltage V2.

On the other hand, when a phase of the second internal clock signal CK_VCO2 is faster than a phase of the reference clock signal CK_REF, the PD 120 outputs the second phase control signal DOWN, and thus, the control voltage $V_C$ may be changed to the third control voltage V3. The VCO 150 may output a third internal clock signal CK_VCO3 having third frequency f3 in response to the second control code CODE2 and the third control voltage V3.

Referring back to FIG. 3, when a frequency of the reference clock signal CK_REF and a frequency of the third internal clock signal CK_VCO3 are the same, the frequency of the third internal clock signal CK_VCO3 may be locked to the frequency of the reference clock signal CK_REF.

When the CDR circuit 100 notifies the timing controller TC that the frequency of the third internal clock signal CK_VCO3 is locked to the frequency of the reference clock signal CK_REF, the timing controller TC may transmit a data packet to the CDR circuit 100.

The PD 120 may receive the data packet from the timing controller TC. The PD 120 may receive the third internal clock signal CK_VCO3 from the VCO 150. The PD 120 may sample a data signal from the data packet using the third internal clock signal CK_VCO3. The PD 120 may output a sampled data signal SDATA and the third internal clock signal CK_VCO3 to the DES 160.

The DES 160 may recover a data signal and a clock signal using the sampled data signal SDATA and the third internal clock signal CK_VCO3. The DES 160 may output the recovered data signal and the recovered clock signal to a logic of the DDI. The recovered data signal may be denoted as RDATA and the recovered clock signal may be denoted as RCK.

Referring to FIGS. 3 and 6 together, the voltage-controlled oscillator VCO may be a 5-stage ring oscillator using inverter coupling. The clock signal output by each stage may have the same phase difference. The PD 120 may sample a data signal from a data packet in response to a clock signal output by each stage.

The DES 160 may receive the sampled data signal SDATA and the third internal clock signal CK_VCO3 from the PD 120. The DES 160 may parallelize the sampled data signal SDATA. The DES 160 may generate a recovered clock signal RCK synchronized with the parallelized data signal and a recovered data signal RDATA. The DES 160 may output the recovered data signal RDATA, e.g., RDATA <17:0>, and the recovered clock signal RCK to a logic of the DDI.

According to an exemplary embodiment of the present inventive concept, the AFC 110 may determine a frequency band FB of the reference clock signal CK_REF using the first internal clock signal CK_VCO1. The AFC 110 may output the frequency band FB of the reference clock signal CK_REF to the CP 130, the LF 140, and the VCO 150. Thus, the CDR circuit 100 may control a parameter of each of the CP 130, the LF 140, and the VCO 150 using the frequency band FB of the reference clock signal CK_REF. Since a parameter of the CDR circuit 100 is adjusted according to a frequency band FB of the reference clock signal CK_REF, even when data the CDR circuit 100 has a wide frequency band, jitter of a clock signal to be recovered may be significantly reduced. In other words, the recovered clock signal may be stable. Thus, the CDR circuit 100 may have a wide operating frequency band.

Figure 7:
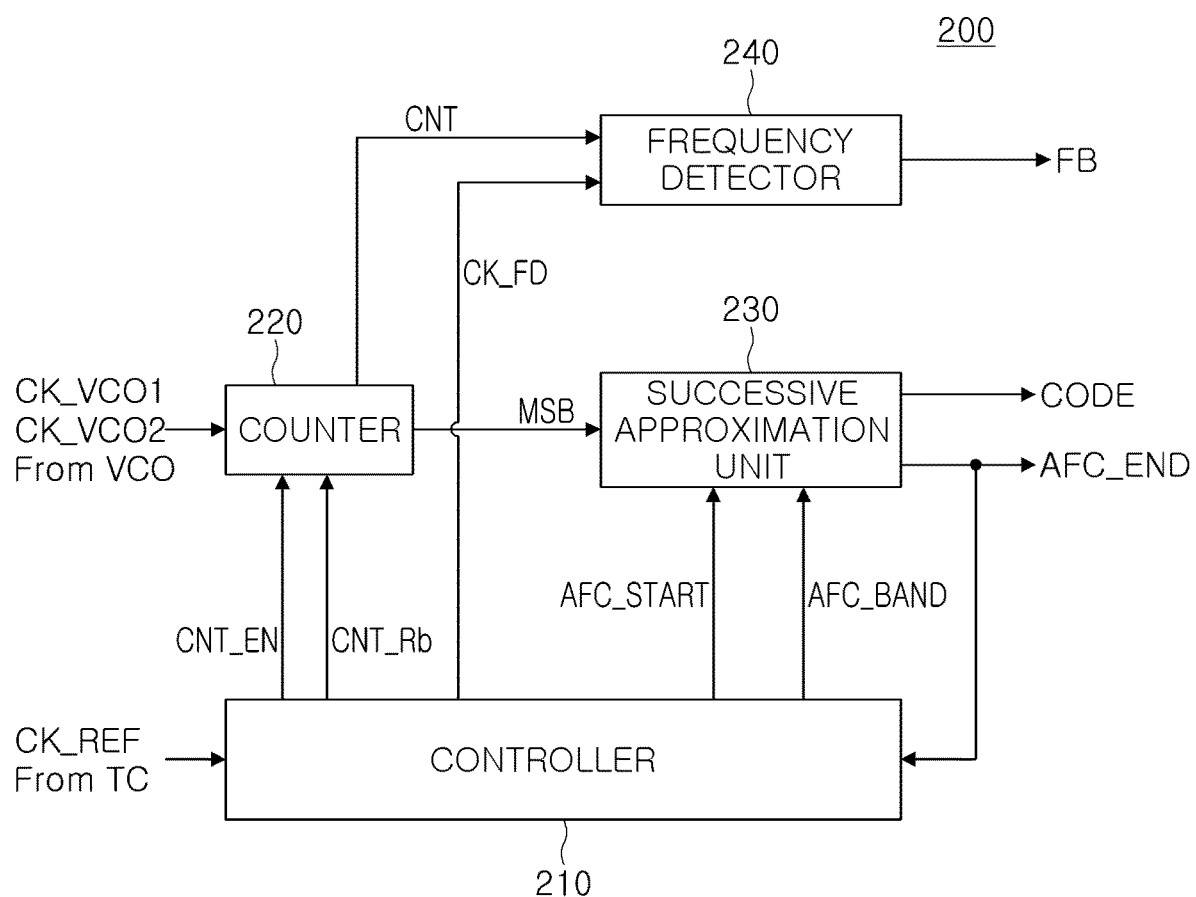
FIG. 7 is a block diagram illustrating an automatic frequency controller according to an exemplary embodiment of the present inventive concept.
Figure 8:
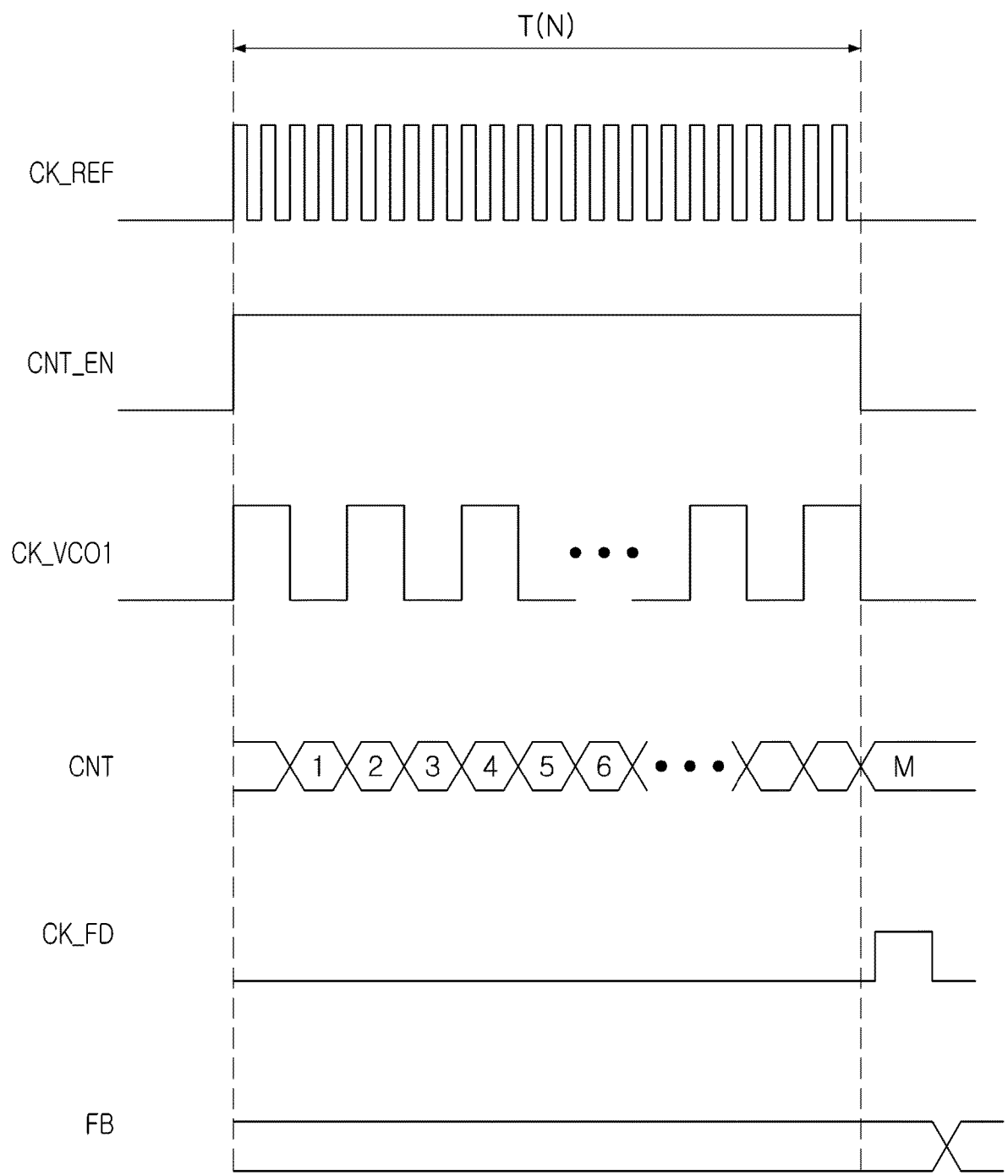
FIG. 8 is a graph illustrating an operation of a counter according to an exemplary embodiment of the present inventive concept.
Figure 9:
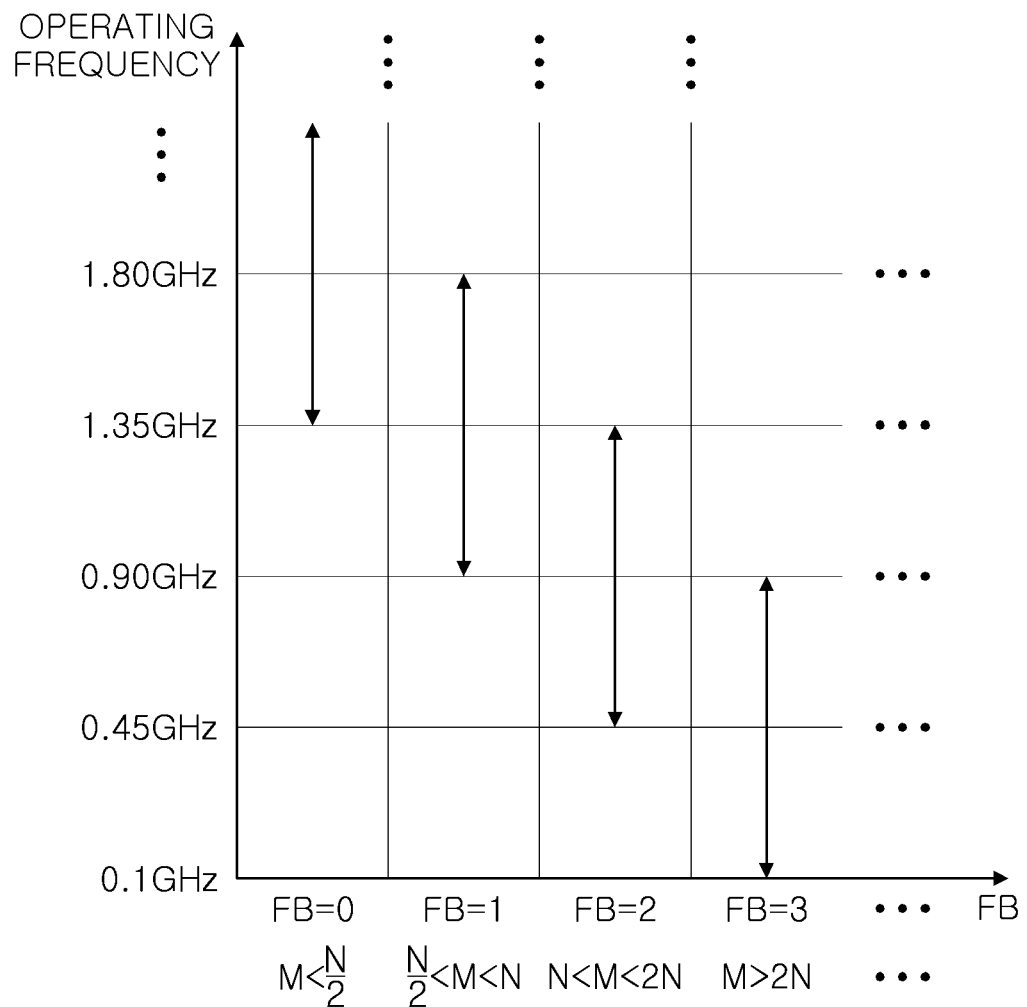
FIG. 9 is a graph illustrating an operation of a frequency detector according to an exemplary embodiment of the present inventive concept.
Figure 10:
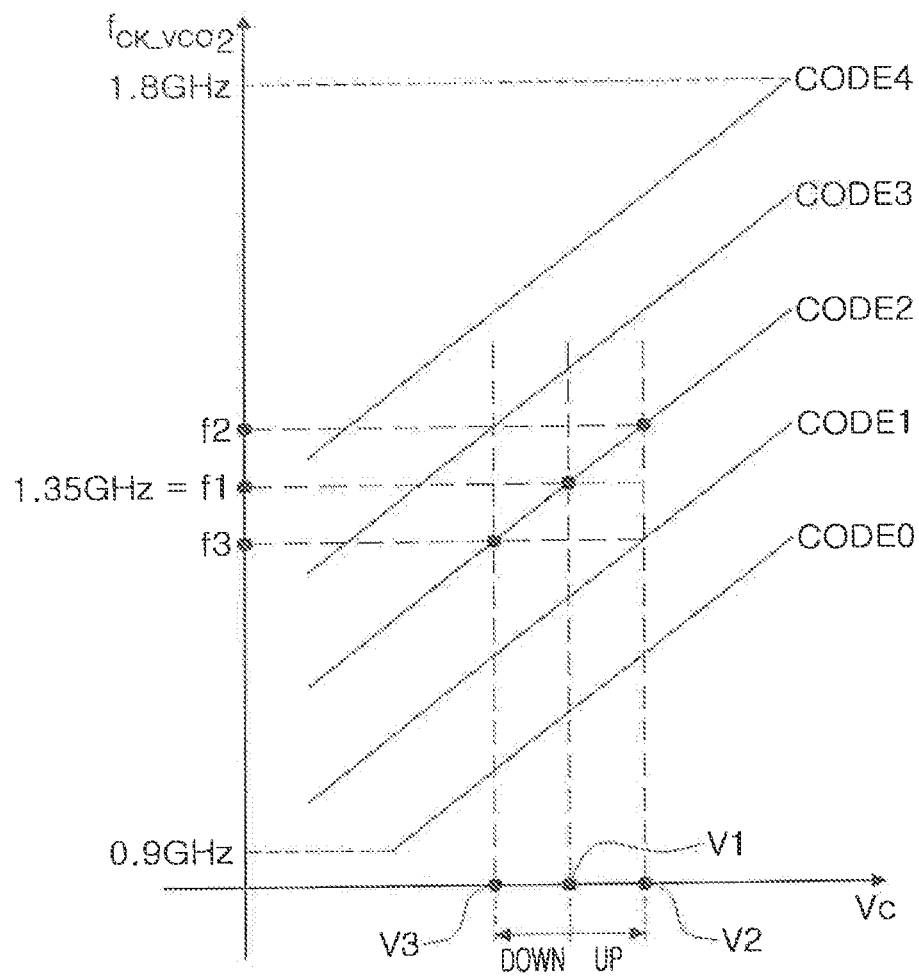
FIG. 10 is a view illustrating a method of tuning a frequency in a voltage-controlled oscillator according to an exemplary embodiment of the present inventive concept.

FIG. 7 is a block diagram illustrating an automatic frequency controller according to an exemplary embodiment of the present inventive concept, FIG. 8 is a graph illustrating an operation of a counter according to an exemplary embodiment of the present inventive concept, FIG. 9 is a graph illustrating an operation of a frequency detector according to an exemplary embodiment of the present inventive concept, and FIG. 10 is a view illustrating a method of tuning a frequency in a voltage-controlled oscillator according to an exemplary embodiment of the present inventive concept.

Referring to FIG. 7, an automatic frequency controller 200 may include a controller 210, a counter 220, a successive approximation unit 230, and a frequency detector 240.

Referring to FIGS. 7 and 8, the controller 210 may receive a reference clock signal CK_REF from a timing controller TC. The controller 210 may determine a time T for which a period of the reference clock signal CK_REF is repeated N times. The controller 210 may output a pulse CNT_EN having a pulse width T based on the time T for which a period of the reference clock signal CK_REF is repeated N times. For example, when a period of the reference clock signal CK_REF is 1 s and N=100 is satisfied, the controller 210 may determine a time (T=100 s) for which a period of the reference clock signal CK_REF is repeated 100 times. The controller 210 may output a pulse CNT_EN having a pulse width T of 100 s.

The counter 220 may receive a counter reset signal CNT_Rb from the controller 210. The counter 220 may be reset in response to the counter reset signal CNT_Rb. The counter 220 may receive the first internal clock signal CK_VCO1 from the voltage-controlled oscillator VCO. The counter 220 may count the number of rising edges of the first internal clock signal CK_VCO1, input for the T times, and may output a count value CNT. In other words, the counter 220 may count the rising edges of the first internal clock signal CK_VCO1 for the time T(N). For example, when a period of the first internal clock signal CK_VCO1 is 2 s, the counter 220 may output a count value (M=50) of rising edges of the first internal clock signal CK_VCO1, input for 100 s.

Referring to FIGS. 7 and 9, the frequency detector 240 may receive a frequency detection clock signal CK_FD from the controller 210. The frequency detector 240 may receive a count value CNT from the counter 220 in response to the frequency detection clock signal CK_FD. The frequency detector 240 may detect a frequency band FB of the reference clock signal CK_REF based on a count value M.

For example, when the count value M is less than half N/2 the number of times a period of the reference clock signal CK_REF is repeated, the frequency detector 240 may determine that a frequency band FB is a first frequency band FB0 of 1.35 GHz or more.

When the count value M is greater than half N/2 the number of times a period of the reference clock signal CK_REF is repeated, and is less than the number of times N a period of the reference clock signal CK_REF is repeated, the frequency detector 240 may determine that the frequency band FB is a second frequency band FB1 in a range of 0.90 GHz to 1.80 GHz.

When the count value M is greater than the number of times N a period of the reference clock signal CK_REF is repeated, and is less than two times 2N the number of times a period of the reference clock signal CK_REF is repeated, the frequency detector 240 may determine that the frequency band FB is a third frequency band FB2 in a range of 0.45 GHz to 1.35 GHz.

When the count value M is greater than two times 2N the number of times a period of the reference clock signal CK_REF is repeated, the frequency detector 240 may determine that the frequency band FB is a fourth frequency band FB3 in a range of 0.1 GHz to 0.90 GHz.

When the count value M is greater than the number of times N a period of the reference clock signal CK_REF is repeated, it may be determined that a frequency band is a low frequency band. When the count value M is less than the number of times N a period of the reference clock signal CK_REF is repeated, it may be determined that a frequency band is a high frequency band.

The VCO 150 may receive a frequency band FB of the reference clock signal CK_REF from the frequency detector 240. For example, as illustrated in FIG. 10, when the frequency band FB is the second frequency band FB1, the VCO 150 may output a second internal clock signal CK_VCO2 having frequency of 1.35 GHz, which is a median in a range of 0.90 GHz to 1.80 GHz.

Referring back to FIG. 7, the counter 220 may receive the second internal clock signal CK_VCO2 generated in response to the frequency band FB of the reference clock signal CK_REF from the VCO 150. The counter 220 may compare a frequency of the reference clock signal CK_REF output by the timing controller TC with a frequency of the second internal clock signal CK_VCO2. For example, the counter 220 may output a logic "1" (MSB=1), when the frequency of the second internal clock signal CK_VCO2 is less than the frequency of the reference clock signal CK_REF. On the other hand, the counter 220 may output a logic "0" (MSB=0), when the frequency of the second internal clock signal CK_VCO2 is greater than the frequency of the reference clock signal CK_REF.

The successive approximation unit 230 may receive an enable signal AFC_START and an output timing signal AFC BAND from the controller 210. The successive approximation unit 230 may be enabled in response to the enable signal AFC START. The enabled successive approximation unit 230 may receive a most significant bit MSB from the counter 220.

The successive approximation unit 230 may generate a control code CODE corresponding to a difference between a frequency of the reference clock signal CK_REF and a frequency of the second internal clock signal CK_VCO2 based on the most significant bit MSB. For example, when the most significant bit MSB is a logic "1", the frequency of the second internal clock signal CK_VCO2 may be increased. On the other hand, when the most significant bit MSB is a logic "0", the frequency of the second internal clock signal CK_VCO2 may be reduced. The successive approximation unit 230 may increase or reduce the frequency of the second internal clock signal CK_VCO2 until the frequency of the second internal clock signal CK_VCO2 is equal to the frequency of the reference clock signal CK_REF. The successive approximation unit 230 may output a control code CODE corresponding to a difference between a frequency of the reference clock signal CK_REF and a frequency of the second internal clock signal CK_VCO2 through an operation of increasing or reducing the frequency of the second internal clock signal CK_VCO2.

The successive approximation unit 230 may output the control code CODE in response to an output timing signal AFC BAND. The successive approximation unit 230 may output an end signal AFC_END together with the control code CODE. The successive approximation unit 230 may output the end signal AFC_END to the controller 210. The end signal AFC_END may be a signal indicating that a frequency of the second internal clock signal CK_VCO2 is synchronized with a frequency of the reference clock signal CK_REF.

The VCO 150 may receive the control code CODE from the successive approximation unit 230. For example, as illustrated in FIG. 10, when the frequency band FB is the second frequency band FB1, and the control code CODE is the second control code CODE2, the VCO 150 may perform fine tuning using the second control code CODE2 and a control voltage and output the third internal clock signal CK_VCO3. The first internal clock signal CK_VCO1, the second internal clock signal CK_VCO2, and the third internal clock signal CK_VCO3 may be referred to as a first feedback clock signal, a second feedback clock signal, and a third feedback clock signal, respectively.

According to an exemplary embodiment of the inventive concept, the CDR circuit may determine a frequency band FB of a reference clock signal CK_REF. For each frequency band FB of the reference clock signal CK_REF, a parameter of a CDR circuit may be adjusted to ensure proper jitter and stability. Thus, the CDR circuit can be optimized for a high speed operation region and can maintain jitter characteristics even in a low speed operation region.

Figure 11:
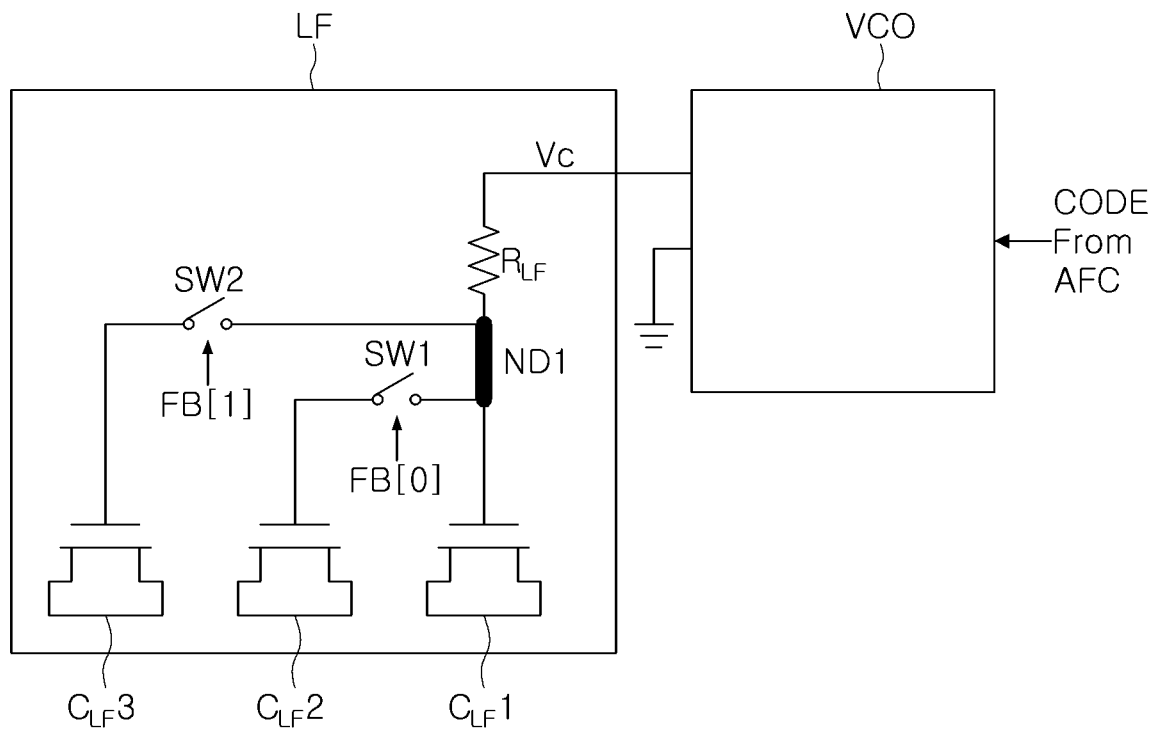
FIG. 11 is a view illustrating a method of adjusting a parameter of a loop filter according to an exemplary embodiment of the present inventive concept.

FIG. 11 is a view illustrating a method of adjusting a parameter of a loop filter according to an exemplary embodiment of the present inventive concept.

Referring to FIG. 11, a loop filter LF may perform coarse tuning to a frequency band FB of a reference clock signal. The coarse tuned loop filter LF may output a control voltage $V_C$ using a voltage-controlled oscillator VCO. The voltage-controlled oscillator VCO may receive the control voltage $V_C$ from the loop filter LF, and may receive a control code CODE from the automatic frequency controller AFC. The voltage-controlled oscillator VCO performs fine tuning using the control code CODE and the control voltage $V_C$ to output an internal clock signal following a reference clock signal. For example, the internal clock signal may be output to components of a CDC circuit including a PLL.

Hereinafter, a method of adjusting a parameter of a loop filter LF will be described.

The loop filter LF may include a resistor $R_{LF}$ and first to third capacitors $C_{LF}1$, $C_{LF}2$ and $C_{LF}3$. The first to third capacitors $C_{LF}1$ to $C_{LF}3$ may be connected in parallel to each other. The first to third capacitors $C_{LF}1$ to $C_{LF}3$, connected in parallel, may be connected in series to the resistor $R_{LF}$ at a first node ND1. A first switch SW1 may be connected between the second capacitor $C_{LF}2$ and the first node ND1, and a second switch SW2 may be connected between the third capacitor $C_{LF}3$ and the first node ND1. The capacitance of the third capacitor $C_{LF}3$ may be greater than the capacitance of the second capacitor $C_{LF}2$.

From the first frequency band FB0 to the fourth frequency band FB3, a frequency band FB of the reference clock signal may be smaller. As the frequency band FB of the reference clock signal is decreased, the capacitance of the loop filter LF may be increased. As the capacitance of the loop filter LF is increased, stability of the CDR circuit may be increased.

For example, when the frequency band FB is the first frequency band (FB0=00), the first switch SW1 may be turned-off in response to a frequency band (FB[0]=0), and the second switch SW2 may be turned-off in response to a frequency band (FB[1]=0). Thus, the capacitance of the loop filter LF may be a value corresponding to the capacitance of the first capacitor $C_{LF}1$.

For example, when the frequency band FB is the second frequency band (FB1=01), the first switch SW1 may be turned-on in response to a frequency band (FB[0]=1), and the second switch SW2 may be turned-off in response to a frequency band (FB[1]=0). Thus, the capacitance of the loop filter LF may have a value corresponding to the sum of the capacitance of the first capacitor $C_{LF}1$ and the capacitance of the second capacitor $C_{LF}2$.

For example, when the frequency band FB is the third frequency band (FB2=10), the first switch SW1 may be turned-off in response to a frequency band (FB[0]=0), and the second switch SW2 may be turned-on in response to a frequency band (FB[1]=1). Thus, the capacitance of the loop filter LF may have a value corresponding to the sum of the capacitance of the first capacitor $C_{LF}1$ and the capacitance of the third capacitor $C_{LF}3$.

For example, when the frequency band FB is the fourth frequency band (FB3=11), the first switch SW1 may be turned-on in response to a frequency band (FB[0]=1), and the second switch SW2 may be turned-on in response to a frequency band (FB[1]=1). Thus, the capacitance of the loop filter LF may have a value corresponding to the sum of the capacitance of the first capacitor $C_{LF}1$, the capacitance of the second capacitor $C_{LF}2$, and the capacitance of the third capacitor $C_{LF}3$. In other words, when the frequency band FB is the fourth frequency band, the capacitance of the loop filter LF may be greatest.

Figure 12:
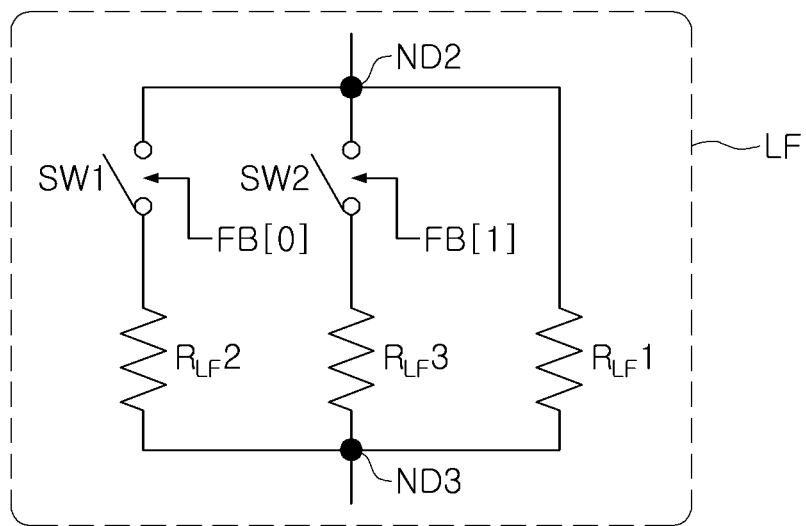
FIG. 12 is a view illustrating a method of adjusting a parameter of a loop filter according to an exemplary embodiment of the present inventive concept.

FIG. 12 is a view illustrating a method of adjusting a parameter of a loop filter according to an exemplary embodiment of the present inventive concept. FIG. 12 is a view in which a resistor $R_{LF}$ is illustrated in detail in the loop filter LF of FIG. 11.

Referring to FIG. 12, the loop filter LF may include first to third resistors $R_{LF}1$, $R_{LF}2$ and $R_{LF}3$. The first to third resistors $R_{LF}1$ to $R_{LF}3$ may be connected in parallel to each other between a second node ND2 and a third node ND3. The first which SW1 may be connected between the second resistor $R_L2$ and the second node ND2, while the second switch SW2 may be connected between the third resistor $R_{LF}3$ and the second node ND2. In other words, the second resistor $R_{LF}2$ may have a larger resistance value than the third resistor $R_{LF}3$.

From the first frequency band FB0 to the fourth frequency band FB3, a frequency band FB of the reference clock signal may be smaller. As the frequency band FB of the reference clock signal is decreased, the resistance of the loop filter LF may be increased.

For example, when the frequency band FB is the first frequency band (FB0=00), the first switch SW1 may be turned-on in response to a frequency band (FB[0]=0), and the second switch SW2 may be turned-on in response to a frequency band (FB[1]=0). Thus, the resistance of the loop filter LF may be a value corresponding to the sum of the resistance of the first resistor $R_{LF}1$, the second resistor $R_{LF}2$, and the third resistor $R_{LF}3$.

For example, when the frequency band FB is the second frequency band (FB1=01), the first switch SW1 may be turned-off in response to a frequency band (FB[0]=1), and the second switch SW2 may be turned-on in response to a frequency band (FB[1]=0). Thus, the resistance of the loop filter LF may be a value corresponding to the sum of the resistance of the first resistor $R_LF1$ and the resistance of the third resistor $R_{LF}3$.

For example, when the frequency band FB is the third frequency band (FB2=10), the first switch SW1 may be turned-on in response to a frequency band (FB[0]=0), and the second switch SW2 may be turned-off in response to a frequency band (FB[1]=1). Thus, the resistance of the loop filter LF may be a value corresponding to the sum of the resistance of the first resistor $R_{LF}1$ and the resistance of the second resistor $R_{LF}2$.

For example, when the frequency band FB is the fourth frequency band (FB3=11), the first switch SW1 may be turned-off in response to a frequency band (FB[0]=1), and the second switch SW2 may be turned-off in response to a frequency band (FB[1]=1). Thus, the resistance of the loop filter LF may be a value corresponding to the resistance of the first resistor $R_{LF}1$. Thus, for example, when the frequency band FB is the first frequency band, the resistance of the loop filter LF may be greatest.

Figure 13:
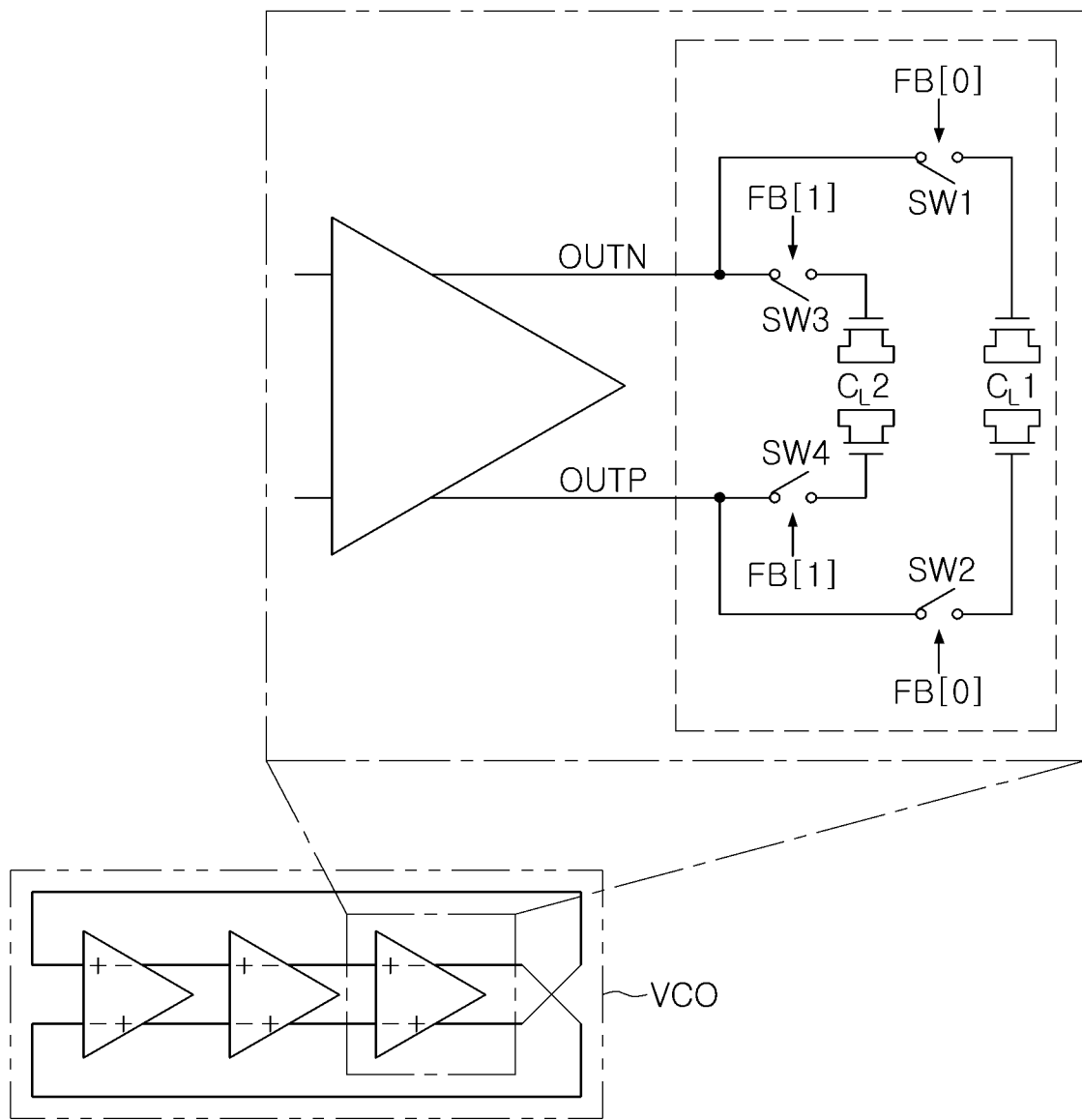
FIG. 13 is a view illustrating a method of adjusting a parameter of a voltage-controlled oscillator according to an exemplary embodiment of the present inventive concept.

FIG. 13 is a view illustrating a method of adjusting a parameter of a voltage-controlled oscillator according to an exemplary embodiment of the present inventive concept. In FIG. 13, a voltage-controlled oscillator VCO, which is a 3-stage ring oscillator using inverter coupling, is illustrated. Referring to an enlarged view in which a single inverter is illustrated, the voltage-controlled oscillator VCO may include a first loading capacitor $C_L1$ and a second loading capacitor $C_L2$. When the first loading capacitor $C_L1$ and the second loading capacitor $C_L2$ are connected to the output of the voltage-controlled oscillator VCO, a loading capacitance of the voltage-controlled oscillator VCO may increase. A first end of the first loading capacitor $C_L1$ and a second end of the second loading capacitor $C_L2$ may be connected to a first output terminal OUTN of the inverter, while a second end of the first loading capacitor $C_L1$ and a second end of the second loading capacitor $C_L2$ may be connected to a second output terminal OUTP of the inverter.

A first switch SW1 may be connected between the first end of the first loading capacitor $C_L1$ and the first output terminal OUTN, while a second switch SW2 may be connected between the second end of the first loading capacitor $C_L1$ and the second output terminal OUTP. A third switch SW3 may be connected between the first end of the second loading capacitor $C_L2$ and the first output terminal OUTN, while a fourth switch SW4 may be connected between the second end of the second loading capacitor $C_L2$ and the second output terminal OUTP.

From the first frequency band FB0 to the fourth frequency band FB3, a frequency band FB of the reference clock signal may be smaller. As the frequency band FB of the reference clock signal is decreased, the loading capacitance of the voltage-controlled oscillator VCO may be increased. The capacitance of the first loading capacitor CL1 may be a first loading capacitance, and the capacitance of the second loading capacitor CL2 may be a second loading capacitance. The second loading capacitance may be greater than the first loading capacitance.

For example, when the frequency band FB is the first frequency band (FB0=00), the first switch SW1, the second switch SW2 may be turned-off in response to a frequency band (FB[0]=0), and the third switch SW3, the fourth switch SW4 may be turned-off in response to a frequency band (FB[1]=0). Thus, the increase of loading capacitance may be 0.

For example, when the frequency band FB is the second frequency band (FB1=01), the first switch SW1, the second switch SW2 may be turned-on in response to a frequency band (FB[0]=1), and the third switch SW3, the fourth switch SW4 may be turned-off in response to a frequency band (FB[1]=0). Thus, the increase of loading capacitance may be a value corresponding to the first loading capacitance.

For example, when the frequency band FB is the third frequency band (FB2=10), the first switch SW1, the second switch SW2 may be turned-off in response to a frequency band (FB[0]=0), and the third switch SW3, the fourth switch SW4 may be turned-on in response to a frequency band (FB[1]=1). Thus, the increase of loading capacitance may be a value corresponding to the second loading capacitance.

For example, when the frequency band FB is the fourth frequency band (FB3=11), the first switch SW1, the second switch SW2 may be turned-on in response to a frequency band (FB[0]=1), and the third switch SW3, the fourth switch SW4 may be turned-on in response to a frequency band (FB[1]=1). Thus, the increase of loading capacitance may be a value corresponding to the sum of the first loading capacitance and the second loading capacitance. Thus, for example, when the frequency band FB is the fourth frequency band, the loading capacitance may be greatest.

Figure 14:
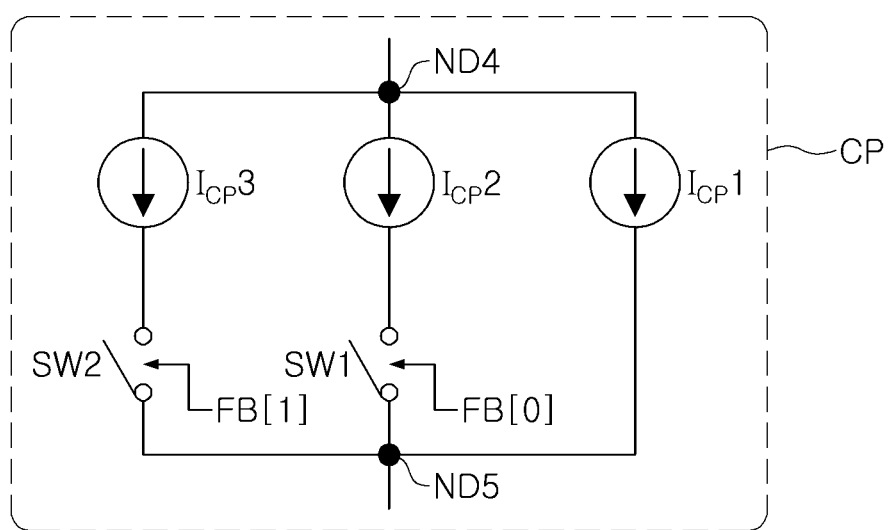
FIG. 14 is a view illustrating a method of adjusting a parameter of a charge pump according to an exemplary embodiment of the present inventive concept.

FIG. 14 is a view illustrating a method of adjusting a parameter of a charge pump according to an exemplary embodiment of the present inventive concept. Referring to FIG. 14, a charge pump CP may include first to third current sources $I_{CP}1$, $I_{CP}2$ and $I_{CP}3$. The first to third current sources $I_{CP}1$ to $I_{CP}3$ may be connected in parallel to each other between a fourth node ND4 and a fifth node ND5. A current of each of the first to third current sources $I_{CP}1$ to $I_{CP}3$ may flow in a direction from the fourth node ND4 to the fifth node ND5. A first switch SW1 may be connected between the second current source $I_{CP}2$ and the fifth node ND5, while a second switch SW2 may be connected between the third current source $I_{CP}3$ and the fifth node ND5. A current, flowing in the third current source $I_{CP}3$, may be higher than a current, flowing in the second current source $I_{CP}2$.

From the first frequency band FB0 to the fourth frequency band FB3, a frequency band FB of the reference clock signal may be smaller. As the frequency band FB of the reference clock signal is decreased, a current amount, flowing from the charge pump CP, may be reduced.

For example, when the frequency band FB is the first frequency band (FB0=00), the first switch SW1 may be turned-on in response to a frequency band (FB[0]=0), and the second switch SW2 may be turned-on in response to a frequency band (FB[1]=0). Thus, a current amount, flowing from the charge pump CP, may correspond to the sum of a current amount flowing from the first current source $I_{CP}1$, a current amount flowing from the second current source $I_{CP}2$, and a current amount flowing from the third current source $I_{CP}3$.

For example, when the frequency band FB is the second frequency band (FB1=01), the first switch SW1 may be turned-off in response to a frequency band (FB[0]=1), and the second switch SW2 may be turned-on in response to a frequency band (FB[1]=0). Thus, the current amount, flowing from the charge pump CP, may be a value corresponding to the sum of a current amount, flowing from the first current source $I_{CP}1$, and a current amount, flowing from the third current source $I_{CP}3$.

For example, when the frequency band FB is the third frequency band (FB2=10), the first switch SW1 may be turned-on in response to a frequency band (FB[0]=0), and the second switch SW2 may be turned-off in response to a frequency band (FB[1]=1). Thus, the current amount, flowing from the charge pump CP, may be a value corresponding to the sum of a current amount, flowing from the first current source $I_{CP}1$, and a current amount, flowing from the second current source $I_{CP}2$.

For example, when the frequency band FB is the fourth frequency band (FB3=11), the first switch SW1 may be turned-off in response to a frequency band (FB[0]=1), and the second switch SW2 may be turned-off in response to a frequency band (FB[1]=1). Thus, a current amount, flowing from the charge pump CP, may be a value corresponding to a current amount flowing from the first current source $I_{CP}1$. Thus, for example, when the frequency band FB is the first frequency band, the current amount flowing from the charge pump CP may be greatest.

As set forth above, according to exemplary embodiments of the present inventive concept, a clock and data recovery circuit may determine a frequency band of a reference clock signal received from a timing controller, and adjust a parameter of a clock and data recovery circuit to have proper jitter and stability for each determined frequency band. Thus, a clock and data recovery circuit, optimized for a high speed operation region, can maintain jitter characteristics even in a low speed operation region, so that a clock and data recovery circuit having a wide operating frequency band can be provided.

While the present inventive concept has been shown and described with reference to exemplary embodiments thereof, it will be apparent to those skilled in the art that modifications and variations could be made thereto without departing from the scope of the present inventive concept, as set forth by the appended claims.

What is claimed is:

1. A clock and data recovery circuit, comprising:
   a frequency detector configured to detect a frequency band of a reference clock signal received from a timing controller by using a first internal clock signal; and
   a charge pump, a loop filter and a voltage controlled oscillator, wherein the clock and data recovery circuit is configured to adjust a parameter of each of the charge pump, the loop filter and the voltage controlled oscillator according to the detected frequency band, and wherein the voltage controlled oscillator is configured to generate a second internal clock signal according to the detected frequency band.

2. The clock and data recovery circuit of claim 1, wherein the loop filter outputs a control voltage to the voltage controlled oscillator, and the voltage controlled oscillator generates a third internal clock signal using a control code received from an automatic frequency controller and the control voltage.

3. The clock and data recovery circuit of claim 1, wherein the parameter of the voltage controlled oscillator is a gain of the voltage controlled oscillator, the parameter of the loop filter is a capacitance or resistance of the loop filter, and the parameter of the charge pump is a current output by the charge pump.

4. The clock and data recovery circuit of claim 3, wherein the loop filter includes a plurality of capacitors connected in parallel and having different capacitances, a plurality of switches connected to each of the plurality of capacitors, and a resistor connected in series with the plurality of capacitors.

5. The clock and data recovery circuit of claim 4, wherein the plurality of switches of the loop filter are turned on and off based on the detected frequency band of the reference clock signal, and the capacitance of the loop filter is determined as a sum of the capacitances of at least one of the plurality of capacitors.

6. The clock and data recovery circuit of claim 3, wherein the loop filter includes a plurality of resistors connected in parallel and having different resistances, and a plurality of switches connected to each of the plurality of resistors.

7. The clock and data recovery circuit of claim 6, wherein the plurality of switches of the loop filter are turned on and off based on the detected frequency band of the reference clock signal, and the resistance of the loop filter is determined as a resistance of composition resistor of at least one of the plurality of resistors.

8. The clock and data recovery circuit of claim 3, wherein the voltage controlled oscillator is a ring oscillator using inverter coupling.

9. The clock and data recovery circuit of claim 3, wherein the voltage controlled oscillator includes a plurality of loading capacitors connected in parallel and having different loading capacitances, and a plurality of switches connected to each of the plurality of loading capacitors.

10. The clock and data recovery circuit of claim 9, wherein the plurality of switches of the voltage controlled oscillator are turned on and off based on the detected frequency band of the reference clock signal, and the gain of the voltage controlled oscillator is determined based on an increase of a loading capacitance of the voltage controlled oscillator by at least one of the plurality of loading capacitors.

11. The clock and data recovery circuit of claim 3, wherein the charge pump includes a plurality of current sources connected in parallel and having different magnitudes, and a plurality of switches connected to each of the plurality of current sources.

12. The clock and data recovery circuit of claim 11, wherein the plurality of switches of the charge pump are turned on and off based on the detected frequency band of the reference clock signal, and the current output by the charge pump is determined as a sum of the current output by at least one of the plurality of current sources.

13. A clock and data recovery circuit, comprising:
an automatic frequency controller for receiving a reference clock signal and a first internal clock signal, detecting a frequency band of the reference clock signal, receiving a second internal clock signal generated by adjusting a frequency of the first internal clock signal according to the frequency band, and outputting a control code corresponding to a difference between a frequency of the reference clock signal and a frequency of the second internal clock signal;
a phase detector for receiving the reference clock signal and the second internal clock signal, and outputting a phase control signal corresponding to a phase difference between the reference clock signal and the second internal clock signal;
a charge pump for outputting a current in response to the phase control signal;
a loop filter for generating a control voltage based on the current output by the charge pump; and
a voltage-controlled oscillator for receiving the control code from the automatic frequency controller and the control voltage from the loop filter, and outputting a third internal clock signal by performing fine tuning using the control code and the control voltage.

14. The clock and data recovery circuit of claim 13, wherein the phase detector generates an up pulse signal for advancing a phase of the reference clock signal when the second internal clock signal is slower than the reference clock signal, and generates a down pulse signal to delay the phase of the reference clock signal when the second internal clock signal is faster than the reference clock signal.

15. The clock and data recovery circuit of claim 14, wherein the up pulse signal is disposed between rising edges of the reference clock signal and the second internal clock signal.

16. The clock and data recovery circuit of claim 14, wherein the down pulse signal is disposed between rising edges of the second internal clock signal and the reference clock signal.

17. The clock and data recovery circuit of claim 13, wherein the automatic frequency controller detects a difference between the frequency of the reference clock signal and the frequency of the second internal clock signal and changes the frequency of the second internal clock signal until it becomes the same as the frequency of the reference clock signal.

18. The clock and data recovery circuit of claim 13, wherein the automatic frequency controller counts a number of rising edges of the first internal clock signal; when a period of the reference clock signal is repeated N times, compares the number of rising edges counted with the N, and detects the frequency band of the reference clock signal according to a result of the comparison.

19. The clock and data recovery circuit of claim 18, wherein the frequency band of the reference clock signal is divided into a plurality of sections, and a parameter determining a jitter characteristic of the clock and data recovery circuit is adjusted based on which section the plurality of sections the frequency band of the reference clock signal is included in.

20. The clock and data recovery circuit of claim 19, wherein the parameter includes a gain of the voltage controlled oscillator, a capacitance or resistance of the loop filter, and a current output by the charge pump.

* * * * *